United States Patent [19]

Lai

[11] Patent Number: 5,232,379
[45] Date of Patent: Aug. 3, 1993

[54] CONNECTOR WITH MOUNTING MEANS FOR SMT

[75] Inventor: Ching-ho Lai, Taipei Hsien, Taiwan

[73] Assignee: Foxconn International, Inc., Sunnyvale, Calif.

[21] Appl. No.: 843,619

[22] Filed: Feb. 28, 1992

[51] Int. Cl.⁵ .......................................... H01R 13/73
[52] U.S. Cl. .................................. 439/570; 248/221.4
[58] Field of Search ................. 439/563, 569, 570, 83, 439/876; 248/201, 221.4; 24/295, 573.3

[56] References Cited

U.S. PATENT DOCUMENTS

| | | | |
|---|---|---|---|
| 3,815,077 | 6/1974 | Anhalt et al. | 439/571 |
| 4,054,345 | 10/1977 | Sherwood | 439/629 |
| 4,575,167 | 3/1986 | Minter | 439/83 |
| 4,655,537 | 4/1987 | Andrews, Jr. | 439/82 |
| 4,681,389 | 7/1987 | Nakazawa et al. | 439/557 |
| 4,713,013 | 12/1987 | Regnier et al. | 439/62 |
| 4,732,565 | 3/1988 | Ito et al. | 439/83 |
| 4,847,588 | 7/1989 | Doutrich | 439/82 |
| 4,850,892 | 7/1989 | Clayton et al. | 439/636 |
| 4,900,276 | 2/1990 | Doutrich | 439/82 |
| 4,907,978 | 3/1990 | Bowen | 439/79 |
| 4,907,987 | 3/1990 | Douty et al. | 439/571 |
| 4,929,194 | 5/1990 | Korsunsky et al. | 439/571 |
| 5,037,327 | 8/1991 | Van Woensel | 439/571 |
| 5,044,988 | 9/1991 | Hirayama | 439/609 |
| 5,044,998 | 9/1991 | Lin | 439/850 |
| 5,073,118 | 12/1991 | Grabbe et al. | 439/82 |
| 5,074,807 | 12/1991 | Parmer | 439/557 |
| 5,076,804 | 12/1991 | Bertho et al. | 439/567 |
| 5,096,440 | 3/1992 | Katsumata | 439/570 |

FOREIGN PATENT DOCUMENTS 210686 2/1987 European Pat. Off. ............ 439/570

Primary Examiner—Gary F. Paumen

[57] ABSTRACT

An electrical connector (10) with mounting means (5) for securement to a printed circuit board (7) comprises an elongated insulative housing (1) having embedded therein and extending therethrough a plurality of contacts (3) the tails (31) of which are bent to be parallel with the board (7). A mounting means (5) positioned at each end of the housing (1) has an L-shaped body (51) including a vertical plate (512) and a horizontal plate (511) which is coplanar with a bottom surface (13) of the housing (1). The mounting means (5) further comprises a U-shaped body (52) vertical to the L-shaped body (51), a portion of which is received within a slot (6) in the housing (1) and has a projecting tab (53) abutting against the inner portion of the slot (6) to fasten the mounting means (5) to the housing (1).

13 Claims, 6 Drawing Sheets

CONNECTOR WITH MOUNTING MEANS FOR SMT

BACKGROUND OF THE INVENTION

1. Field of The Invention

The present invention relates to mounting means for a connector, and particularly to a mounting ear for a Surface Mount Technology (SMT) connector, which is capable of securing the connector against the surface of the board by soldering.

2. Description of the Prior Art

As mentioned in U.S. Pat. No. 5,044,988, in mounting on a circuit board an electrical connector having contacts secured in a plastic housing, it is typical to mount such connector on the the connector housing, and extending from the bottom surface of the housing into holes bored in the circuit board at predetermined locations. See, for example, U.S. Pat. Nos. 4,713,013, 4,850,892, 4,929,194, and 5,076,804.

To overcome the disadvantages of insufficient resilient characteristics of the integral post, some recent patents disclose using a separate metallic resilient post associated with the housing to retain the connector assembly on the board. See, for example, U.S. Pat. Nos. 4,681,389, 4,907,987, 5,044,998, 5,037,327, and 5,074,807.

These two different types of posts can be applied to a typical connector which adopts through-hole contacts and posts, and which has enough space to support these posts.

Although these apparatus exist for providing electrical connectors with mounting means for securement to a printed circuit board, they are not satisfactory for a header connector, especially for a SMT header connector.

Referring to FIG. 1, a header is a connector of the type mounted on a board for receiving another complementary component, or connecting a cable through an IDC (Insulation Displacement Contact) component. Because a miniature header has limited space, for example, the cross-section being $\frac{1}{8} \times 32/5''$, the downwardly extending integral posts are so small and fragile as to be deemed only an orientation means for aligning the corresponding holes on the board, and not a reliable securing means. Because there is no other means to hold the header main body, i.e. insulator, on the board, the interconnection between the header and the board is through the contacts retained within the passageways of the header and soldered on the board.

Some prior art connectors use a kink structure on some contacts to increase the retention force between the contact and the board hole, and this added retention force is helpful to retain the contacts and their associated connector for a subsequent wave soldering process in which the contacts are soldered on the board. Examples are shown in U.S. Pat. Nos. 4,054,345, 4,847,588 and 4,900,276. Other prior art connectors change the straight type contact to a biased or a compliant type to increase the frictional force between the contact and the board hole for the same reason. Examples are shown in U.S. Pat. Nos. 4,575,167, 4,655,537, 4,907,978, and 5,073,118. These variant type contacts only offer a minor increase of reinforcement or retention force between the contact and the board hole to assure that the insulator accompanying the contacts will not be elevated and separated from the board by the liquid solder during the wave soldering process.

But another consideration that requires attention, is that when a corresponding component is inserted into or withdrawn from the header, a relatively large force or moment will act on the header, and transfer to the contacts because the securing portions are set on the contact tails within the board holes. In this situation, the solder portions of the contacts may be eventually damaged and the header will swing on the board defectively. This problem will be more serious when this situation happens to a right angle surface-mount type header. In that event, the tails of the contacts are soldered on and in parallel with the board, and also positioned parallel to the header insulator, so the bending moment due to insertion or withdrawal of the complementary component can be deemed to act directly on the solder portions of the contacts. It can be understood that having contacts subjected to all the forces resulting from insertion or withdrawal of the complementary component is not recommended, so using an additional auxiliary mounting means on a header to absorb these forces is desired and required. Until the instant invention, there is no header, especially a SMT header that utilizes an auxiliary mounting means for providing a main support of securement of the header to a board.

As aforementioned, the miniature header has a thin body and a limited space, and it is not easy to find a sufficient large place to install a large, strong mounting means on the header to achieve securement. Because SMT and miniaturization are the trends in this field, using a mounting means having a proper shape which can be firmly installed within or on the header, and also easily applied to SMT for fixedly and strongly securing the header on the board, is one of the objects of the present invention.

Another object of the invention is to provide a header connector having an auxiliary mounting means but requiring no increase of the insulator dimension.

Yet another object of the invention is to provide a header connector having an auxiliary mounting means that cooperates with a previously existing integral post which functions as an orientation means to position the header in position on the board for the following reflow soldering process of SMT.

SUMMARY OF THE INVENTION

In accordance with the present invention, an electrical connector for mounting to a printed circuit board includes an elongated insulative housing having embedded therein and extending therethrough a plurality of contacts the tails of which are bent to be parallel with the board. A mounting means positioned at each end of the housing has an ear portion one surface of which extends in coplanarity with a bottom surface of the housing. The mounting means further comprises a U-shaped body vertical to the plane of the ear portion, which is received within a slot in the housing and has a projecting tab abutting against the inner portion of the slot to fasten the mounting means to the housing.

DESCRIPTION OF THE PREFERRED EMBODIMENT

Figure 1:
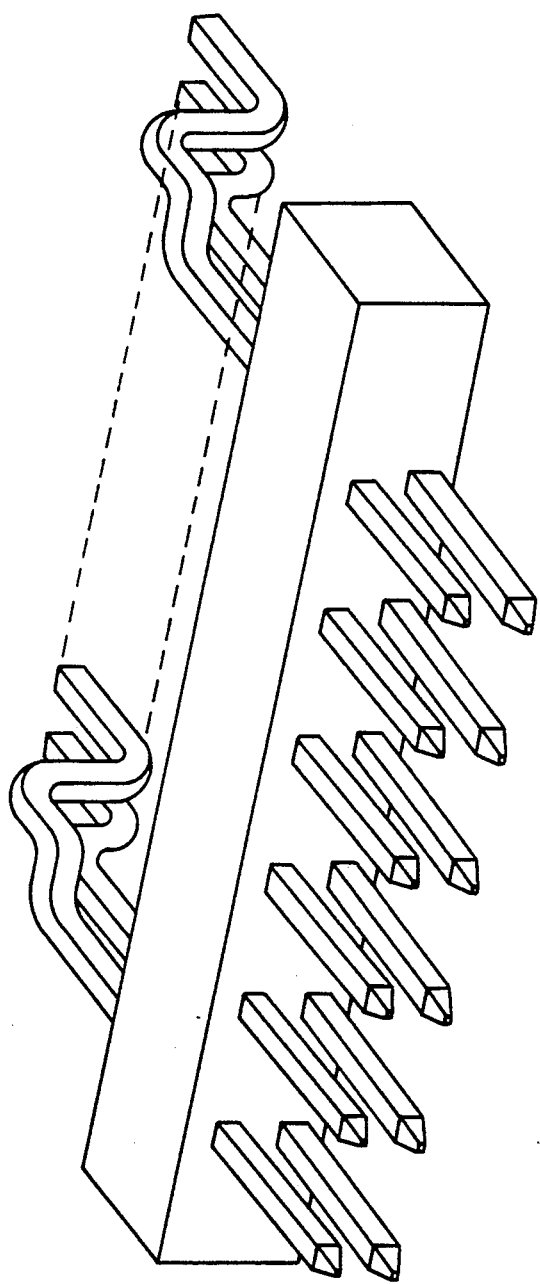
FIG. 1 is an perspective view of a prior art header connector and illustrating the absence of any auxiliary mounting means.
Figure 2A:
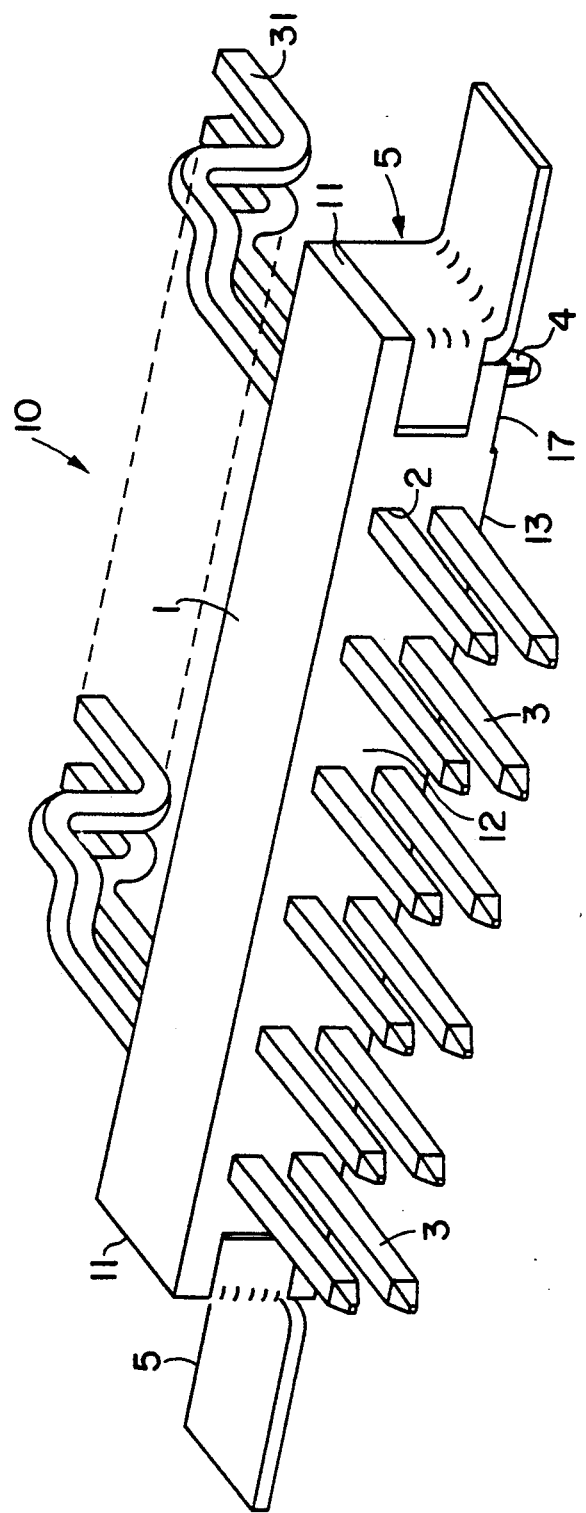
FIG. 2(A) is a perspective view of one presently preferred embodiment of a header connector equipped
Figure 7:
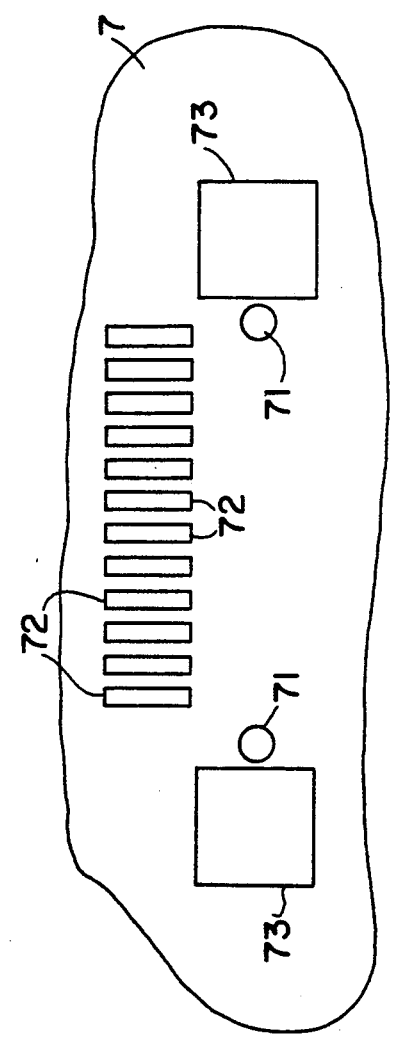
FIG. 7 is a fragmentary plan view of a PC board laid out for cooperation with the connector of FIG. 2(A).
Figure 5A:
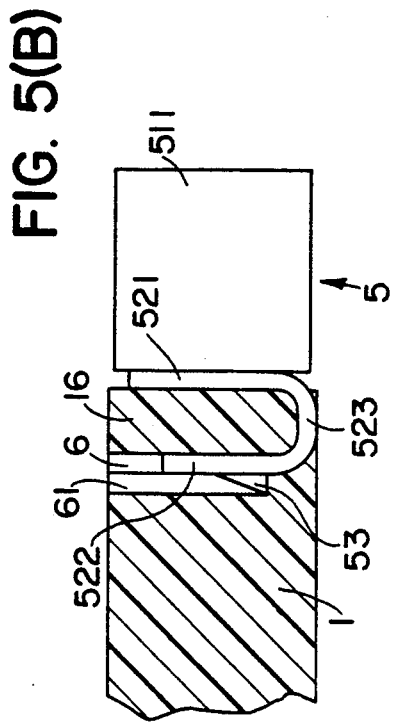
FIG. 5(A) is an enlarged fragmentary front view of the connector of FIG. 4(B).
Figure 5B:
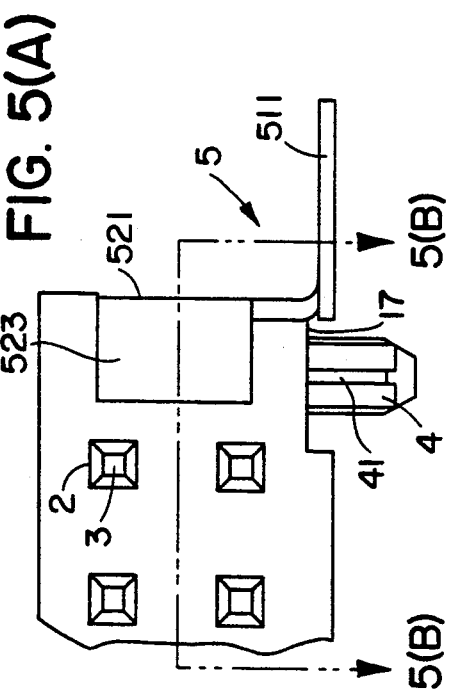
FIG. 5(B) is a horizontal cross-sectional view along the line 5(B)—5(B) of FIG. 5(A).

Referring to FIG. 2(A), the subject header connector member designated generally by the numeral 10 includes an elongated insulative housing 1 having extending therethrough a plurality of passageways 2 receiving a plurality of corresponding contacts 3, of which each tail 31 is bent at right angles to place the tail portion 31 parallel with the surface of a corresponding board 7 as shown in FIG. 7 which the connector housing and the tail portions are seated against. The housing 1 has two opposite side surfaces 11, a front surface 12, and a bottom surface 13 from which, at two opposite ends, a pair of posts 4 (only one shown in FIG. 2(A)) extend downward.

Figure 3:
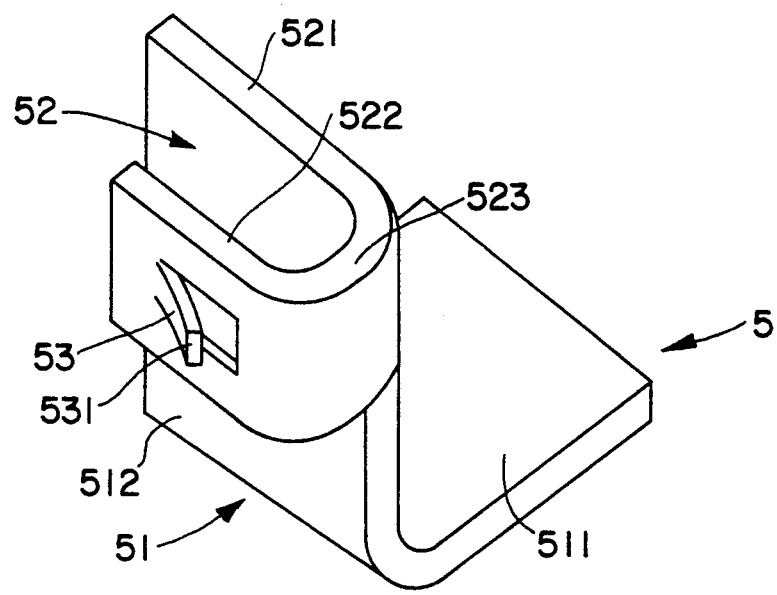
FIG. 3 is a perspective view of the mounting means of FIG. 2(A).

A pair of mounting means 5 are, respectively, positioned at opposite ends of the housing 1. Referring to FIG. 3, each mounting means is comprised of an L-shaped body portion 51 and an integral U-shaped body portion 52 perpendicular to each other wherein the L-shaped body 51 includes a horizontal mounting plate 511 (deemed as a mounting section) in coplanarity with the bottom surface 11 of the housing 1, and a vertical plate 512 extending upward from one end of the horizontal plate 511 as shown. The U-shaped body 52, deemed as a retention section, is positioned at the top end of the vertical plate 512, and includes an outer wall 521 integral with and forming a coplanar part of the vertical plate 512, and an inner wall 522 connected integrally with the outer wall 521 by a bight portion 523. An inward projecting tab 53 is struck from the surface of the inner wall 522. In this embodiment, the tab 53 is formed by stamping the material of the inner wall 522 directly so that the tip 531 of the tab 53 lies spaced from the peripheral surface of the inner wall 522 as shown.

Figure 2B:
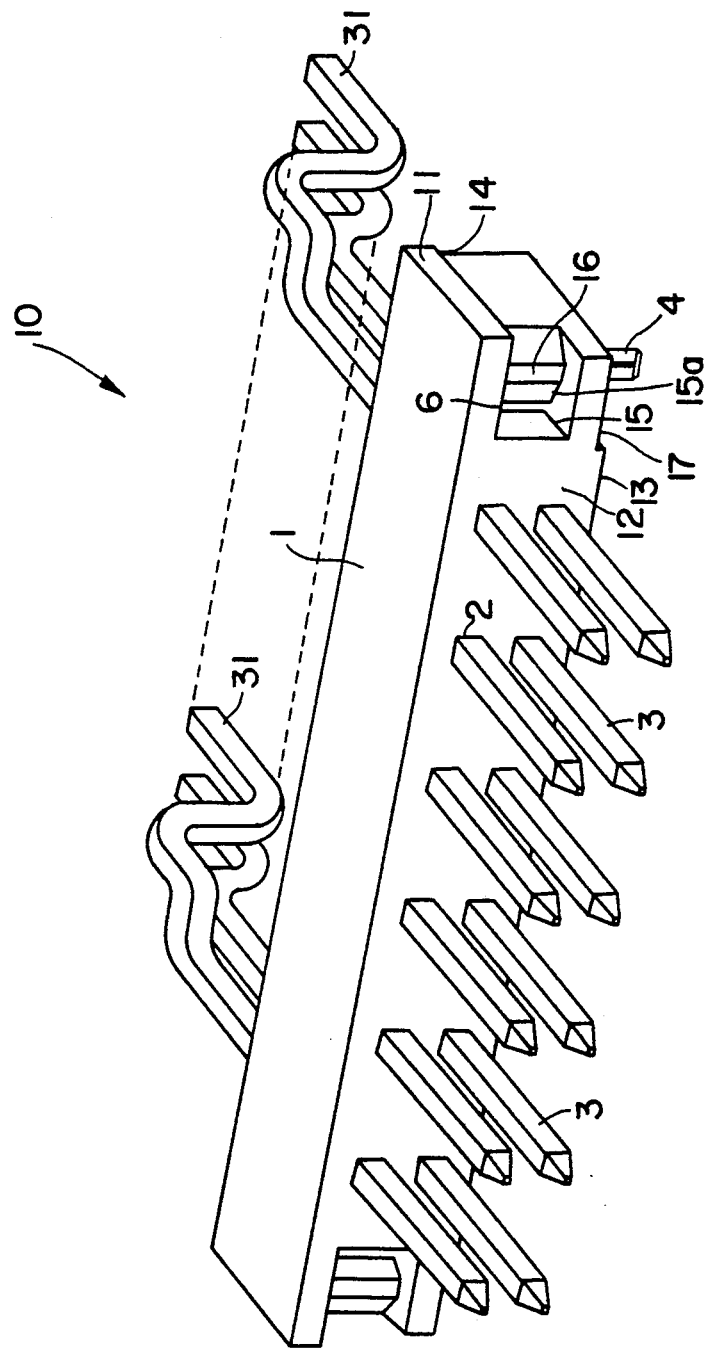
FIG. 2(B) is a perspective view of the connector of FIG. 2(A) with the mounting means removed to illustrate the slot in which the mounting means is received.
Figure 6A:
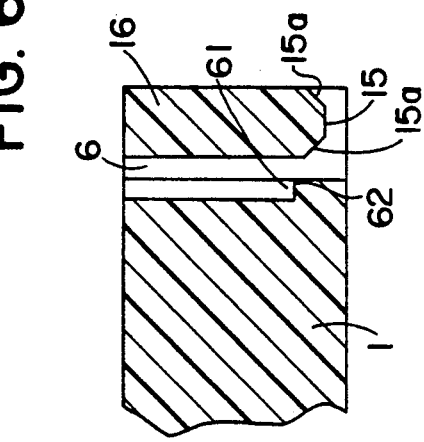
FIG. 6(A) is the view of the connector of FIG. 5(A) but without the mounting means to show the slot in the housing.
Figure 6B:
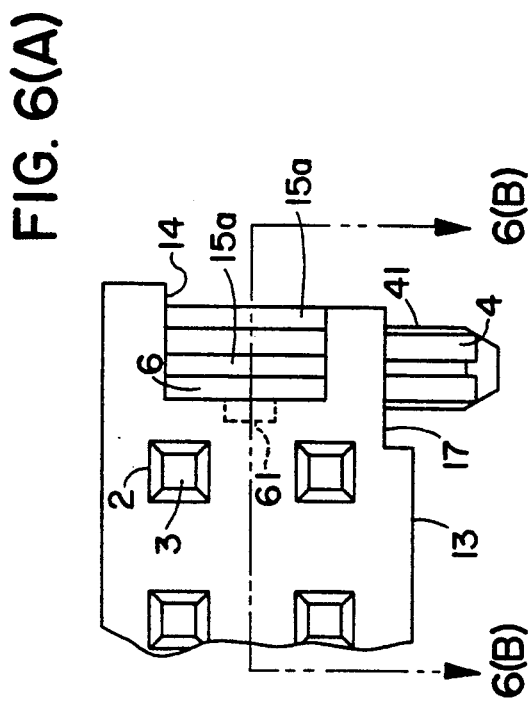
FIG. 6(B) is a cross-sectional view along the line 6(B)—6(B) of the connector of FIG. 6(A).

Referring to FIGS. 2(B), 6(A), 6(B), to operatively cooperate with the mounting means 5, at each end of the housing 1 a slot 6 extends therethrough in parallel with the associated side surface 11. The height of the slot 6 is conformable to the width of the inner wall 522 of the mounting means 5. To receive the vertical plate 512 of the corresponding mounting means 5, an offset 14 is formed on the side surface 11. Similarly, in communication with the offset 14, a recess 15 is formed at each end of the front surface 12. To conform to the bight portion 523 of the mounting means 5, two opposed chamfers 15a are formed on the two front corners of an integral retention portion 16 defined between the offset 14 and the slot 6. By cooperation of the offset 14 and the recess 15, the vertical plate 512 with the associated coplanar outer wall 521, and the bight portion 513 of the mounting means 5 lie within the outer profile of the housing when assembled.

Within the housing 1, groove 61 is formed in the side wall of slot 6 in a parallel relation as shown in FIG. 6(A), the height being conformable to the width of the projecting tab 53. The groove 61 communicates with the slot 6 but, unlike the slot 6, is terminated by a step or shoulder 62 formed at its lower front end. The step 62 cooperates with tab 53 to provide the mounting means 5 with an anti-withdrawal characteristic.

Four integral ribs 41 are axially and circumferentially positioned on the periphery of the post 4 at equal intervals. The ribs 41 provide an interference fit when the post 4 is inserted into the corresponding hole 71 of the board 7 shown in FIG. 7. An offset or recess 17 is formed in the bottom surface 13 around the post 4 as shown in FIG. 6(A). The recess 17 receives any particles of the ribs 41 which may be separated or scraped from the post 4 during insertion of the post 4 in the hole 71 so that the particles will not affect accurate positioning of the connector on the board 7.

Figure 4A:
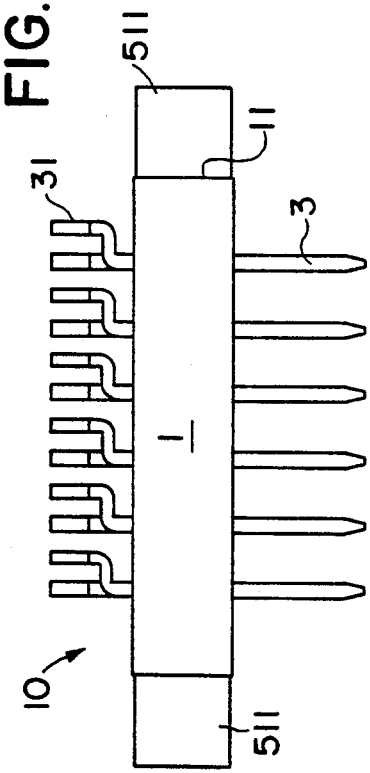
FIG. 4(A) is a plan view of the connector equipped with the mounting means.
Figure 4B:
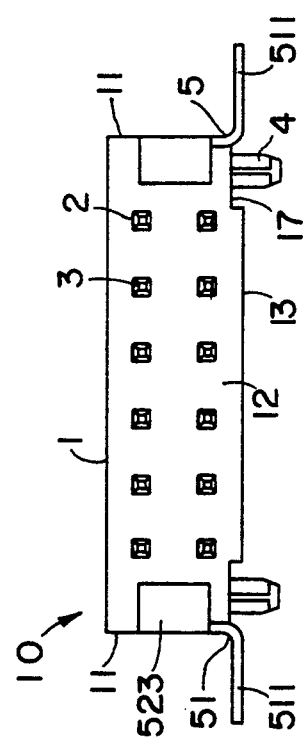
FIG. 4(B) is a front elevation of the connector of FIG. 4(A).
Figure 4C:
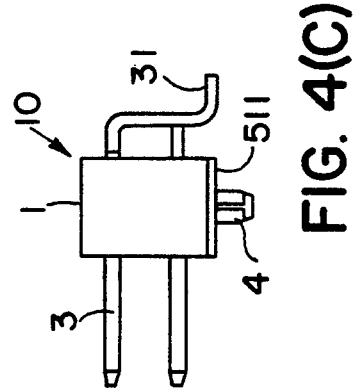
FIG. 4(C) is an end view of the connector of FIG. 4(B).

Referring to FIGS. 2(A) and 4(C), the tails 31 of the upper contacts have been laterally biased a small amount in order to lie in planar alignment with the tails of the lower contacts in a direction parallel to the housing 1.

Referring to FIGS. 2(A), 2(B), 5(A) and 5(B), the mounting means 5 is applied to the housing 1 by inserting the inner wall 522 into the slot 6 from the front surface 12. During the process, the outer wall 521 moves along the offset 14 of the side surface 11, and the projecting resilient tab 53 is resiliently depressed until the bight portion 523 of the mounting means 5 abuts the front surface of the retention portion 16 within the recess 15. When this occurs, the tip 531 of the projecting tab 53 is released from the slot 6 and springs outward so the tab 53 can be totally received within the lateral groove 61 thus precluding withdrawal because of abutment of tip 531 with the step 62. The vertical plate 512 with the associated coplanar outer wall 521, and the bight portion 523 of the mounting means 5 are embedded within the offset 14 and the recess 15, respectively, so the assembly to the insulative housing can still keep the original profile. Referring to FIG. 4(B), the bottom surface of the horizontal mounting plate 511 is in planar alignment with the bottom surface 13 of the housing and the recess 17 is ready for reception of any particles from the ribs 41.

Referring to FIG. 7, the layout illustrated corresponds to the header connector 10, the PC board 7 having a pair of spaced holes 71 for fixedly receiving the posts 4 by an interference fit therein. A plurality of laterally aligned metalized solder areas 72 are provided for coupling as by soldering to a plurality of corresponding tail portions of the contacts. A pair of opposite spaced metalized solder areas 73 are provided beside the pair of holes 71 and to which the horizontal plates 51 of the mounting means 5 are adapted to be soldered. In this embodiment, the soldering process of SMT can be a reflow process such as vapor phase, or radiant infrared (IR) which electrically couples not only the contact tails 31 but also the mounting sections, i.e. horizontal plates 511. Therefore, the connector 1 can be fixedly secured very rigidly to the board 7 by means of press-fitted posts, soldered contact tails, and especially soldered mounting means 5 to provide a degree of rigidity and reliability not heretofore available.

It can be understood that the present invention provides a conventional miniature header connector 10 with SMT mounting means 5 which not only corresponds to the metalized solder areas 73 adhered to the board 7, but also keeps the original dimension of the housing 1 of the connector 10.

It can be seen that although, to be compatible with the miniature housing 1, only the simple thin slot 6 accompanying the lateral groove 61 are adaptively configured to be parallel with the side surface within the housing 1 for securely retaining the mounting means 5, through the U-shaped body 52 clamping the retention portion 16 of the housing 1, the mounting means 5 thus providing a significantly stable and fixed securement with the connector housing 1. Also, the abutment of projecting tab tip 531 and the step 62 is perpendicular to the mounting section, i.e. the horizontal plate 511, so the tab 53 has little opportunity of be released from the step 62 as a result of any vibration imposed on the horizontal plate 511.

It is believed that the SMT contacts 3 of the connector 1 of the invention will not be easily damaged due to insertion or withdrawal forces imposed by a complementary component because the mounting means 5 will absorb most of the occurring forces. The mounting sections, i.e. the horizontal plates 511, extend outwardly at two ends of and in alignment with the housing 1, thus effectively increasing the base dimensions of the connector 10, so that the stress due to insertion or withdrawal forces can be symmetrically, equally applied, balanced and dispersed.

It is noted that through the integral combination of the L-shaped body 51 and U-shaped body 52, the mounting means 5 forms a three dimensional structure which can distribute the stress transferred from the horizontal plate 511 to the other portions so that the mounting means 5 provides a reliable and strong attachment means.

While the invention has been described in connection with what is presently considered to be the most practical and preferred embodiments, it is to be understood that the invention is not limited to the disclosed embodiment but, on the contrary, is intended to cover various modifications and equivalent arrangements included within the spirit and the scope of the appended claims.

What is claimed is:

1. An electrical connector for application to a circuit board, comprising:
   an elongated insulative housing having a plurality of contacts secured therethrough and having a slot therein adjacent to and parallel with a side surface of the housing; and
   mounting means including a U-shaped body and an one-piece therewith, said U-shaped body secured to the housing through the slot and said L-shaped body adapted to mount to the circuit board.

2. The electrical connector as described in claim 1, wherein the L-shaped body includes a horizontal plate and a vertical plate extending upwardly from an inner end of the horizontal plate, and the U-shaped body includes an outer wall integral with the vertical plate, and an inner wall integrally connected to the outer wall by a bight portion.

3. The electrical connector as described in claim 2, wherein the inner wall of the mounting means includes an integral projecting tab, and said slot includes a groove so that when the inner wall is received within the slot, said tab is locked within the groove.

4. The electrical connector as described in claim 3, wherein the housing has offsets on the side surfaces of the housing, and recesses on a front surface of the housing for reception, respectively, of the outer wall and the bight portion of the mounting means.

5. The electrical connector as described in claim 4, wherein the housing further comprises a post on a bottom surface thereof having a plurality of ribs axially extending thereon and a recess in the vicinity of said post.

6. The electrical connector as described in claim 3, wherein the tab is perpendicular to the horizontal plate.

7. An electrical connector for application to a circuit board and having a multiplicity of conductive contacts, comprising:
   an insulative housing having a plurality of passageways extending therethrough for receiving said conductive contacts and having an integral retention portion at each end of the housing; and
   a connector mounting means including a U-shaped body engaging the retention portion of the housing an L-shaped body for mounting the connector to the circuit board.

8. The electrical connector as described in claim 7, wherein the U-shaped body is perpendicular to and one-piece with the L-shaped body.

9. The electrical connector as described in claim 8, wherein, the retention portion has two chamfers on two corners thereof to substantially conform to the U-shaped body when the latter is applied to the retention portion.

10. The electrical connector as described in claim 9, wherein the housing includes a slot associated with said retention portion, a groove and a step in said slot, and a tab on the U-shaped body for engagement with said groove and step to prevent withdrawal of the mounting means from the housing.

11. The electrical connector as described in claim 10, wherein a post is provided on a bottom surface of the housing, said post having a plurality of axially extending ribs spaced at circumferentially equal intervals positioned thereon, and a recess in the bottom surface of the housing at the base of the post.

12. A mounting means for a SMT electrical connector comprising:
   a generally L-shaped body having a horizontal plate and a vertical plate extending upwardly from an inner end of the horizontal plate; and
   a generally U-shaped body having an outer wall one-piece with the vertical plate of the L-shaped body and an inner wall integrally connected to the outer wall by a bight portion.

13. The mounting means for a SMT electrical connector as described in claim 12, wherein the inner wall further includes an integral projecting tab.

* * * * *